United States Patent
Kamezawa et al.

(10) Patent No.: US 10,523,164 B2
(45) Date of Patent: Dec. 31, 2019

(54) SEMICONDUCTOR INTEGRATED CIRCUIT

(71) Applicant: Ricoh Company, Ltd., Tokyo (JP)

(72) Inventors: Sho Kamezawa, Osaka (JP); Tohru Kanno, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/020,047

(22) Filed: Jun. 27, 2018

(65) Prior Publication Data

US 2019/0028075 A1 Jan. 24, 2019

(30) Foreign Application Priority Data

Jul. 18, 2017 (JP) .................................. 2017-139016

(51) Int. Cl.
*H03F 3/45* (2006.01)
*H03F 1/02* (2006.01)
*H03F 1/14* (2006.01)

(52) U.S. Cl.
CPC ....... *H03F 3/45188* (2013.01); *H03F 1/0211* (2013.01); *H03F 3/45089* (2013.01); *H03F 2200/129* (2013.01); *H03F 2200/156* (2013.01); *H03F 2200/297* (2013.01); *H03F 2200/396* (2013.01); *H03F 2203/45156* (2013.01); *H03F 2203/45226* (2013.01); *H03F 2203/45264* (2013.01); *H03F 2203/45512* (2013.01); *H03F 2203/45536* (2013.01)

(58) Field of Classification Search
USPC .................................................. 330/252–261
See application file for complete search history.

(56) References Cited

U.S. PATENT DOCUMENTS

| 7,750,732 B1* | 7/2010 | Delano ................. H03F 1/0233 330/127 |
| 2017/0264844 A1 | 9/2017 | Kamezawa et al. |
| 2017/0269630 A1 | 9/2017 | Kamezawa et al. |

FOREIGN PATENT DOCUMENTS

| JP | 11-041040 | 2/1999 |
| JP | 2009-194708 | 8/2009 |
| JP | 2011-238103 | 11/2011 |
| JP | 2017-169192 | 9/2017 |
| JP | 2017-174394 | 9/2017 |

* cited by examiner

*Primary Examiner* — Hieu P Nguyen
(74) *Attorney, Agent, or Firm* — Xsensus LLP

(57) ABSTRACT

A semiconductor integrated circuit including a differential amplifier circuit, a first output circuit, a second output circuit, a selection circuit, and a feedback circuit. The differential amplifier circuit is configured to operate at a first source voltage. The first output circuit is configured to receive an output of the differential amplifier circuit, output a first output, and operate at the first source voltage. The second output circuit is configured to receive an output of the differential amplifier circuit, output a second output, and operate at a second source voltage lower than the first source voltage. The selection circuit is configured to select one of the first output from the first output circuit and the second output from the second output circuit according to an operating phase determined by an external control signal. The feedback circuit is connected between the differential amplifier circuit and the selection circuit. The feedback circuit is configured to feed the selected output back to the differential amplifier circuit.

20 Claims, 6 Drawing Sheets

US 10,523,164 B2

SEMICONDUCTOR INTEGRATED CIRCUIT

CROSS-REFERENCE TO RELATED APPLICATION

This patent application is based on and claims priority pursuant to 35 U.S.C. § 119(a) to Japanese Patent Application No. 2017-139016, filed on Jul. 18, 2017 in the Japan Patent Office, the entire disclosure of which is hereby incorporated by reference herein.

BACKGROUND

Technical Field

Embodiments of the present disclosure relate to a semiconductor integrated circuit.

Background Art

Semiconductor integrated circuits are currently implemented in systems in which both analog circuits and digital circuits are used. With increasingly higher operating speeds, there is concomitant demand for a reduction in power consumption not only for digital circuits but also for analog circuits.

An analog-to-digital converter (ADC), which is an interface between the analog circuit and the digital circuit, consumes a larger amount of current as the sampling rate increases. Such an increase in consumption current leads to difficulty in achieving both high-speed operation and reduced power consumption.

As one approach to achieving a reduction in power consumption in the analog circuit, for example, an analog circuit technology to drive a high-power consuming ADC at low voltage is known.

More specifically, the power consumption of a circuit is obtained by multiplying the source voltage by the consumption current. Accordingly, reducing the source voltage or the consumption current achieves a reduction in power consumption.

Transconductance ($g_m$), which determines the performance of an analog circuit is in turn itself almost wholly determined by the current flowing through the circuit elements. Thus, reducing the source voltage while maintaining the same current enables a reduction in power consumption in proportion to the reduction in voltage.

At the same time, however, in systems that drive sensors, dynamic range is a major factor, and reducing the source voltage of the analog circuit adversely narrows the dynamic range.

To avoid such a situation, a configuration has been proposed in which the sensor, the circuits surrounding the sensor, and an amplifier circuit for amplifying a signal output from the sensor are driven at a high source voltage while the later-stage ADC is driven at a low source voltage. Such a configuration achieves a reduction in power consumption over the system as a whole while maintaining high performance.

SUMMARY

In one aspect of this disclosure, there is provided an improved semiconductor integrated circuit including a differential amplifier circuit, a first output circuit, a second output circuit, a selection circuit, and a feedback circuit. The differential amplifier circuit is configured to operate at a first source voltage. The first output circuit is electrically connectable to the differential amplifier circuit. The first output circuit is configured to receive an output of the differential amplifier circuit, output a first output, and operate at the first source voltage. The second output circuit is electrically connectable to the differential amplifier circuit. The second output circuit is configured to receive an output of the differential amplifier circuit, output a second output, and operate at a second source voltage lower than the first source voltage. The selection circuit is electrically connectable to each of the first output circuit and the second output circuit. The selection circuit is configured to select one of the first output from the first output circuit and the second output from the second output circuit according to an operating phase determined by an external control signal. The feedback circuit is connected between the differential amplifier circuit and the selection circuit. The feedback circuit is configured to feed the selected one of the first output and the second output back to the differential amplifier circuit.

BRIEF DESCRIPTION OF THE DRAWINGS

The aforementioned and other aspects, features, and advantages of the present disclosure will be better understood by reference to the following detailed description when considered in connection with the accompanying drawings, wherein.

Figure 1:
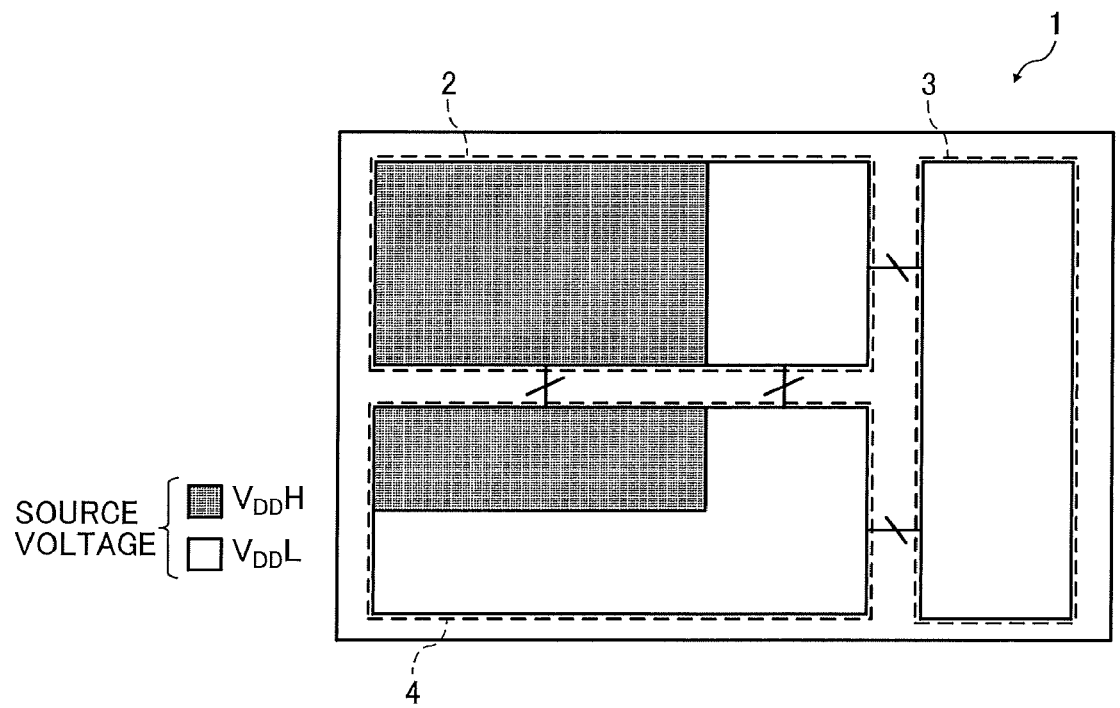
FIG. 1 is an illustration of a schematic configuration of a semiconductor integrated circuit driven at two source voltages.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

Embodiments of the present disclosure are described with reference to the drawings. Note that like reference signs denote like elements among the drawings for purposes of simplification.

FIG. 1 is an illustration of a schematic configuration of a semiconductor integrated circuit 1 designed to be driven with two types of source voltages.

In FIG. 1, the semiconductor integrated circuit 1 includes a plurality of functional blocks 2 through 4. The functional blocks 2 through 4 constitute the semiconductor integrated circuit 1 having one or more functions, and the functional blocks 2 through 4 are connected to each other through a plurality of signal lines. For example, the functional block 2 includes an analog circuit, such as a sensor circuit, an amplifier circuit, an analog-to-digital (A/D) conversion circuit, and each of the functional blocks 3 and 4 includes a digital circuit that, for example, generates clock timing signals and performs logical operations.

The withstand voltage used for a device (transistor) differs between a circuit driven with a high source voltage VDDH and a circuit driven with a low source voltage VDDL. This is because, when the source voltage is low, there is a need to reduce a threshold value Vth that affects the processing performance of the integrated circuit. Accordingly, a low withstand voltage (low operating voltage) transistor is used for the low source voltage. Further, the low operating voltage transistor is miniaturized, which enables high integration.

Note that there are some cases in which a high withstand voltage element is used when the source voltage is low.

In the digital circuit, a level shifter is used as an interface between different power sources, which enables a relatively easy and safe voltage boost and step-down. However, a continuous value voltage is supplied to the analog circuit. Accordingly, it is difficult to provide an interface between different power sources.

To prevent overvoltage from being applied from the high voltage driving circuit to the low voltage driving circuit, it is conceivable to provide a protection circuit in the interface between circuits. Such a provision of the protection circuit, however, complicates the circuit and increases chip size.

Figure 2:
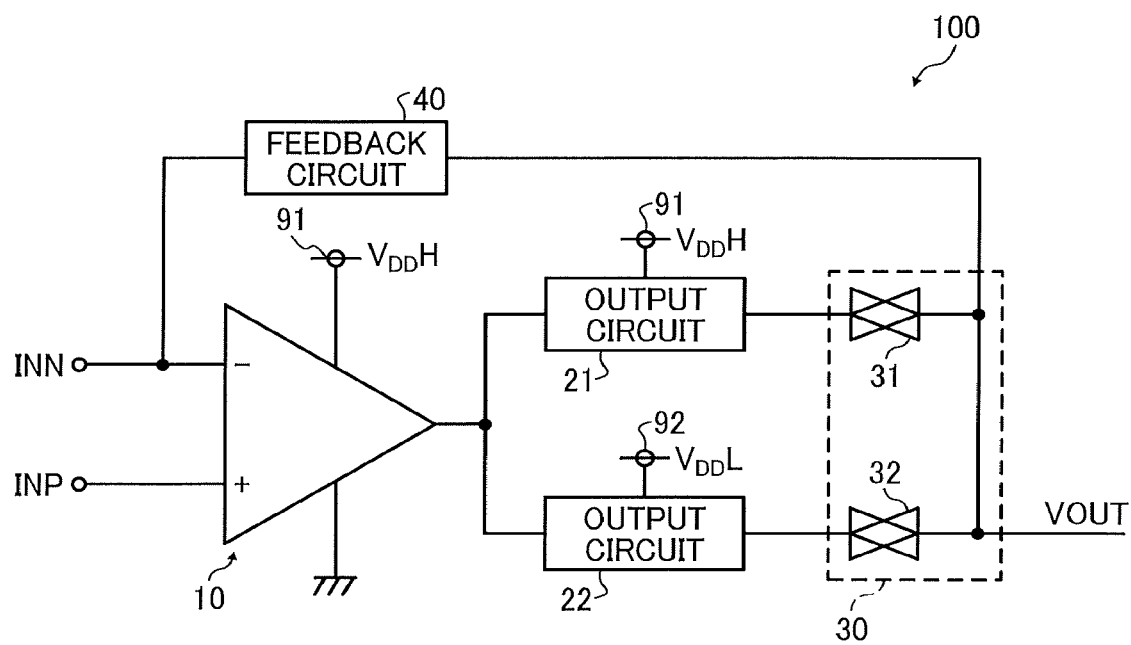
FIG. 2 is a circuit diagram of a semiconductor integrated circuit according to an embodiment of the present disclosure.

To avoid such a situation, in the embodiments of the present disclosure, a dual-output differential amplifier circuit is used, as shown in FIG. 2 and described in detail below. In the dual output configuration, a first output circuit is driven at a high source voltage VDDH (a first source voltage) and a second output circuit is driven at a low source voltage VDDL (a second source voltage). The differential amplifier circuit switches between the first output circuit 21 and the second output circuit 22 according to the operating phase of the output circuit. The differential amplifier circuit 10 is also referred to as "operational amplifier circuit" or "operational amplifier".

Specifically, the high-voltage driving circuit (the first output circuit) is used for feedback and the low-voltage driving circuit (the second output circuit) is used for amplification. This configuration enables a limit to be imposed on the voltage output from the high-voltage driving circuit (the first output circuit in the present embodiment) without restricting the range of a voltage to be fed back to the differential amplifier circuit.

Hereinafter, a semiconductor integrated circuit 100 according to one embodiment will be described with reference to the drawings.

FIG. 2 is a circuit diagram of the semiconductor integrated circuit 100 according to an embodiment of the present disclosure.

The semiconductor integrated circuit 100 includes the differential amplifier circuit 10, output circuits 21 and 22 (the first output circuit and the second output circuit), a selection circuit 30, and a feedback circuit 40. The selection circuit 30 includes analog switches 31 and 32 to switch between the output circuit 21 and the output circuit 22. The semiconductor integrated circuit 100 receives the high source voltage VDDH supplied from a voltage source 91 and receives the low source voltage VDDL lower than the high source voltage VDDH supplied from a voltage source 92.

The differential amplifier circuit 10, which is driven by the high source voltage VDDH, amplifies and outputs the difference between the inverting input from the inverted input terminal INN and the non-inverting input from the non-inverted input INP.

The output circuit 21 as the first output circuit is connected to the output node of the differential amplifier circuit 10 and operates at the high source voltage VDDH. The output circuit 22 as the second output circuit is also connected to the output node of the differential amplifier circuit 10 and operates at the low source voltage VDDL.

The selection circuit 30 is connected to the output node of the output circuit 21 and the output node of the output circuit 22. The selection circuit 30 selects one of the first output from the output circuit 21 and the second output from the output circuit 22, according to the operating phase.

The operating phase includes a first phase to sample and feed the input from the differential amplifier circuit 10 back to the differential amplifier circuit 10 and a second phase to amplify and output the input from the differential amplifier circuit 10. The operating phase is determined by an external control signal input from the outside of the semiconductor integrated circuit 100.

The analog switch 31 is a first switch connected to the output node of the output circuit 21 (first output circuit). The analog switch 32 is a second switch connected to the output node of the output circuit 22 (second output circuit).

When one of the analog switches 31 and 32 is ON, the other is turned off, which means that both are controlled not to be ON at the same time. This is because, when the analog switches 31 and 32 are turned on at the same time, an overvoltage might be applied to a later-stage circuit. A configuration in which both analog switches 31 and 32 are controlled not to be ON at the same time avoids such a situation.

The feedback circuit 40 is connected between the output node of the selection circuit 30 and the non-inverted input terminal INN of the differential amplifier circuit 10. The feedback circuit 40 feeds the signal selected and output by the selection circuit 30 back to the differential amplifier circuit 10.

The output node of the selection circuit 30 is connected to the later-stage circuit. The selection circuit 30 selects one of the first output and the second output and outputs the selected one as the output voltage VOUT to the later-stage circuit. The output node of the selection circuit 30 is connected, for example, to an analog switch to switch the signal path or to the input of the ADC that is driven by the low voltage.

Next, an example of the operation of the semiconductor integrated circuit 100 is described.

The differential amplifier circuit 10 amplifies and outputs the difference between the inverted input and the non-inverted input. The output circuit 21 receives the output of the differential amplifier circuit 10, and operates with the high source voltage VDDH, thus outputting the first output. The output circuit 22 receives the output of the differential amplifier circuit 10, and operates with the low source voltage VDDL, thus outputting the second output.

The selection circuit 30 externally receives a control signal, and receives a first output from the output circuit 21 and a second output from the output circuit 22. The selection circuit 30 switches between the output circuit 21 and the output circuit 22 to output one of the first output and the second output, according to the operating phase determined by the control signal. When the first phase is determined by the control signal, the analog switch 31 is selected (turned on) to output the first output. When the second phase is determined by the control signal, the analog switch 32 is selected (turned on) to output the second output.

The feedback circuit 40 receives the output selected by the selection circuit 30 and feeds the received signal back to the non-inverted input terminal INN of the differential amplifier circuit 10.

Hereinafter, an example of an application of the semiconductor integrated circuit 100 according to an embodiment will be described.

Figure 3:
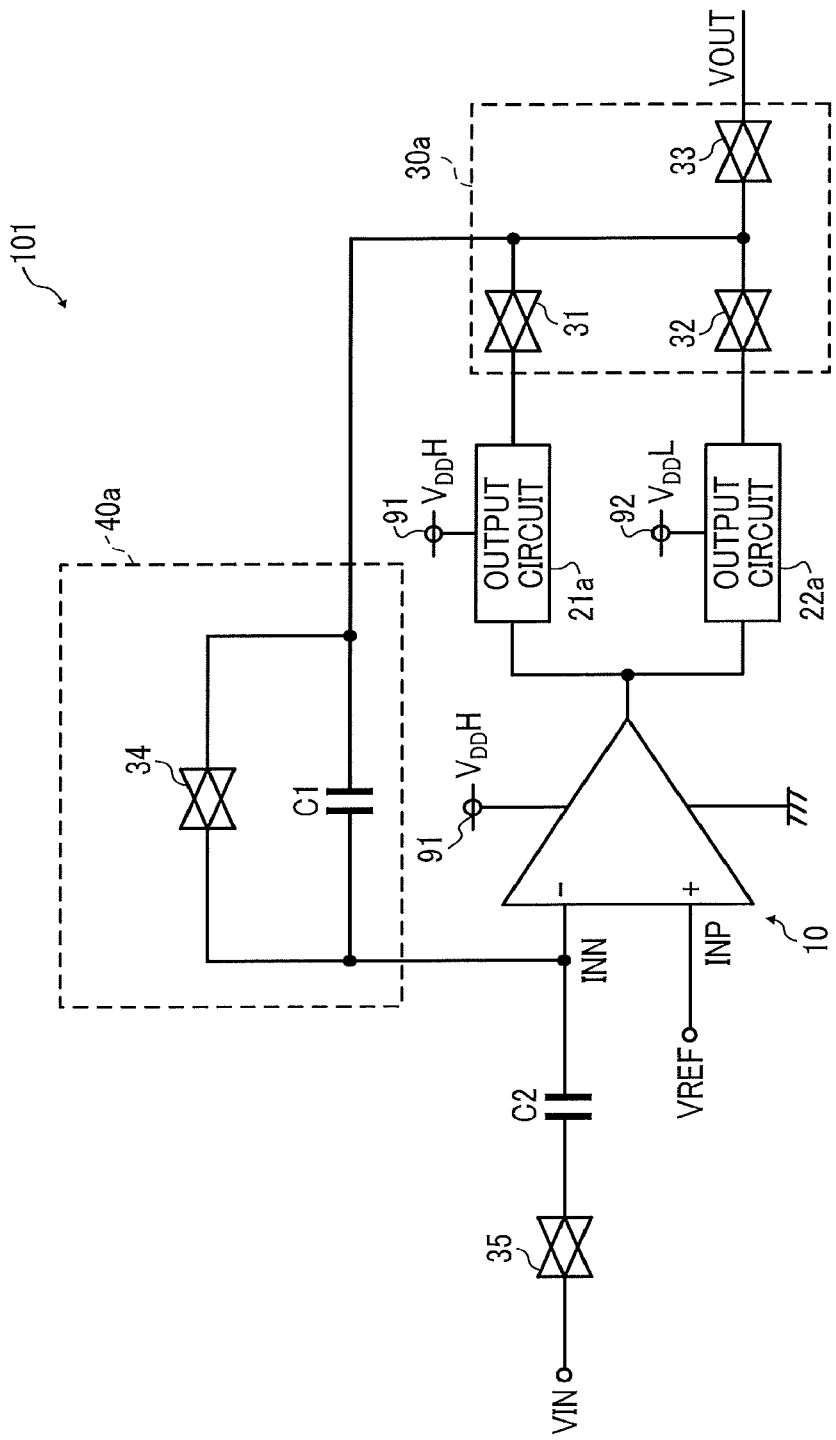
FIG. 3 is a circuit diagram illustrating an example in which a semiconductor integrated circuit according to one embodiment is applied to an amplifier circuit.
Figure 4:
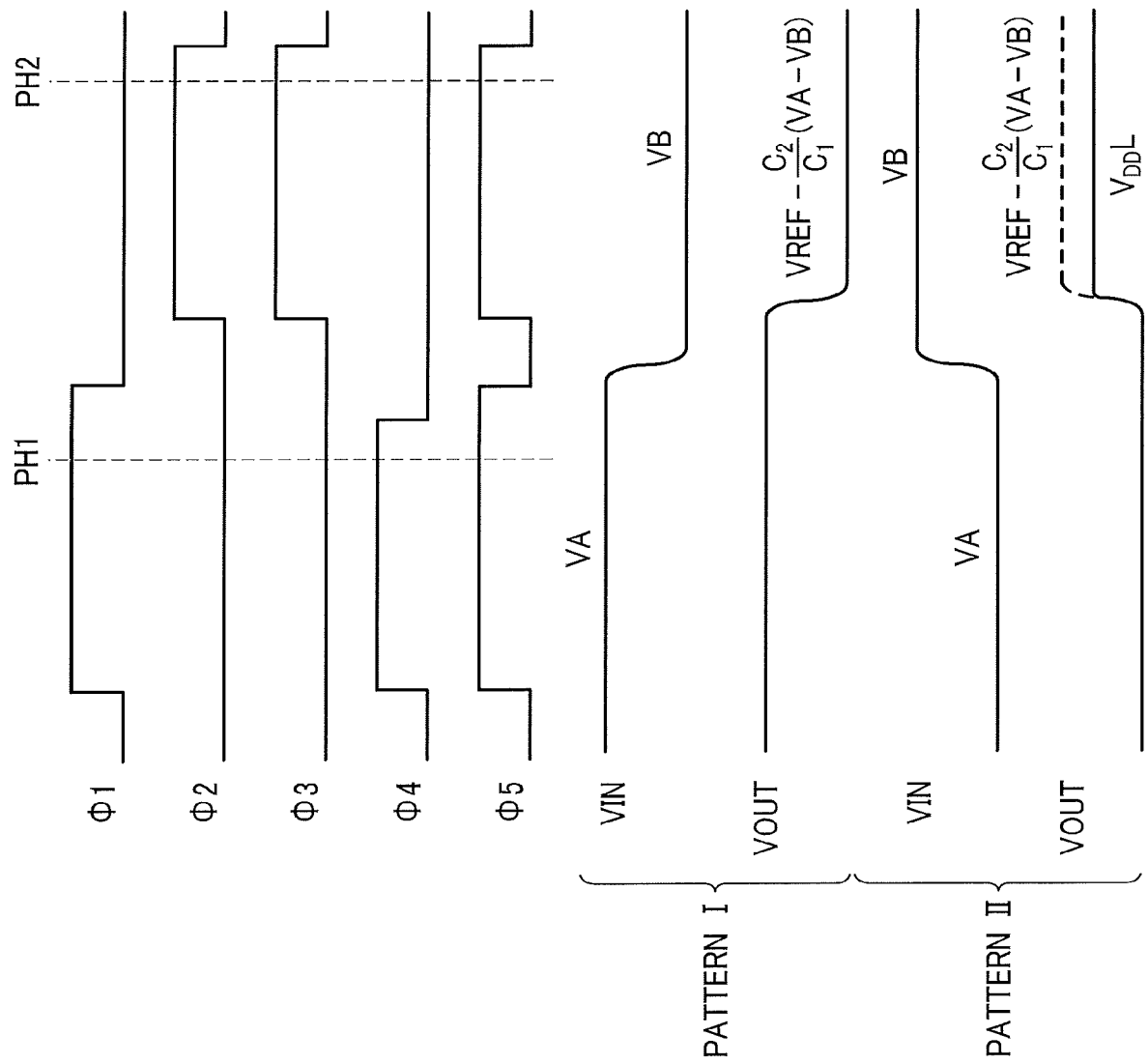
FIG. 4 is a timing chart of an operation of the semiconductor integrated circuit in FIG. 3.

FIG. 3 is a circuit diagram of an example in which a semiconductor integrated circuit 101 according to one embodiment is applied to an amplifier circuit. FIG. 4 is a timing chart of the semiconductor integrated circuit 101 of FIG. 3.

FIG. 3 is a circuit diagram of an example configuration of a semiconductor integrated circuit 101 formed by applying the configuration according to an embodiment of the present disclosure to a known amplifier circuit. The semiconductor integrated circuit 101 includes the differential amplifier circuit 10, output circuits 21a and 22a, analog switches 31 through 35, and capacitors C1 and C2. The analog switches 31 through 33 constitute a selection circuit 30a. A feedback circuit 40a includes the analog switch 34 and the capacitor C1.

The semiconductor integrated circuit 101 of FIG. 3 receives a first signal VA and a second signal VP as an input voltage VIN, and obtains an output value through the following. The difference between the first signal VA and the second signal VB is multiplied by a multiple number of a value to obtain a voltage value. The value is obtained by dividing the electrical potential of the capacitor C2 by the electrical potential of the capacitor C1. The voltage value is subtracted from the reference voltage VREF to obtain the output value.

Similarly to FIG. 2, the selection circuit 30a selects (turns on) the analog switch 31 to output the first output in the first phase and selects (turns on) the analog switch 32 to output the second output in the second phase, which are determined by the control signal.

Further, in the second phase, the selection circuit 30a outputs the selected second output to the later-stage circuit connected to the output node of the semiconductor integrated circuit 101, through the analog switch 33 turned ON. In the first phase, the selection circuit 30a is controlled not to output the selected first output to the later-stage circuit. Specifically, the analog switch 33 is configured to be ON when the analog switch 31 is OFF and the analog switch 32 is ON. The provision of the analog switch 33 prevents the first output from being output as the output voltage VOUT to the later-stage circuit.

The specific operation of the semiconductor integrated circuit 101 will be described with reference to the timing chart of FIG. 4. In the present embodiment, the control signals $\Phi 1$ through $\Phi 5$ control the analog switches 31 through 35, respectively. Each of the analog switches 31 through 35 becomes active with a high input.

The first phase PH1 is a sampling period in which the reference voltage VREF having passed through the differential amplifier circuit 10 and the output circuit 21 is fed back to the capacitor C2, to sample the first signal VA. With the analog switch 34 turned OFF, the electrical charge can be held between the capacitor C1 and the capacitor C2. The second phase PH 2 is an amplification period. The output voltage VOUT is obtained by the equation (1) below:

$$VOUT = VREF - C2/C1(VA - VB) \qquad (1).$$

When the values of the capacitors C1 and the capacitance C2 are variable, the amplification factor can be changed.

In the first phase PH1, both the control signal $\Phi 1$ and $\Phi 4$ are high. When $\Phi 4$ is low, the sampling period ends and a hold period to hold electrical charges starts.

In the second phase PH 2, the control signal $\Phi 2$ is high. The timings in the first phase PH1 and the second phase PH2 indicated by dotted lines respectively indicate any desired timing.

The pattern I in FIG. 4 represents the waveforms of the input voltage VIN and the output voltage VOUT when the first signal VA greater than the second signal VB (VA>VB) and the second signal VB are input to the input terminal VIN. In the period during which the analog switch 33 is active (ON), the output value is obtained by the equation (1). In this case, the first signal VA is greater than the second signal VB (VA>VB) and accordingly the output value obtained is lower than the reference voltage VREF.

The pattern II in FIG. 4 represents the waveforms of the input voltage VIN and the output voltage VOUT when the first signal VA smaller than the second signal VB (VA<VB) and the second signal VB are input to the input terminal VIN. In the period during which the analog switch 33 is active (ON), the output value is obtained by the equation (1). In this case, the first signal VA is smaller than the second signal VB (VA<VB) and accordingly the output value obtained is greater than the reference voltage VREF.

Note that, when the output voltage VOUT is greater than the low source voltage VDDL (VOUT>VDDL), the output voltage VOUT is clipped to the low source voltage VDDL by the output circuit 22a. Thus, the output voltage VOUT is the low source voltage VDDL. Therefore, no overvoltage greater than the low source voltage VDDL is supplied to the later-stage circuit.

In this case as well, the analog switches 31 and 32 are controlled not to be turned ON at the same time.

Note that there are some cases in which a voltage greater than the low source voltage VDDL is subjected to the feedback in a period such as the sampling period.

In such cases, no desired amount of voltage is obtained due to failed feedback control. This is because the voltage to be subjected to the feedback is restricted by merely restricting the output voltage by the output circuit 22 (22a in FIG. 3).

By providing the output circuit 21 (21a in FIG. 3), the output amplitude is increased, which enables successful feedback control even when feedback is performed with a voltage greater than the low source voltage VDDL.

Figure 5:
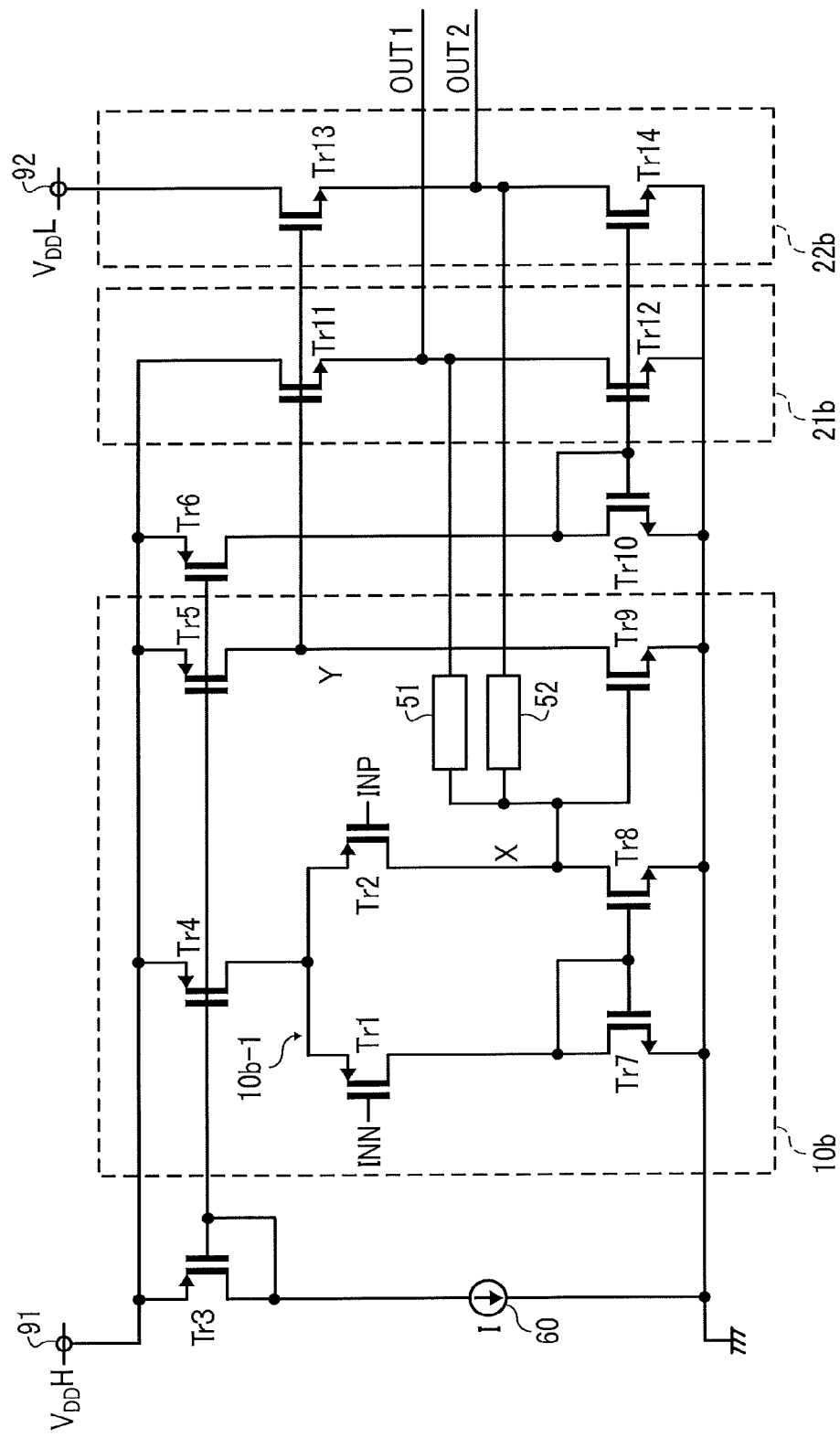
FIG. 5 is a circuit diagram of a differential amplifier circuit and output circuits according to an embodiment of the present disclosure.

FIG. 5 is a circuit diagram of a differential amplifier circuit 10b and output circuits 21b and 22b according to an embodiment of the present disclosure.

The differential amplifier circuit 10b includes phase compensation circuits 51 and 52, a constant current source 60, and transistors Tr1 through Tr14.

The differential amplifier circuit 10b operates at the high source voltage VDDH. The differential amplifier circuit 10b has a typical two-stage configuration that includes a differential amplifier 10b-1 and an amplifier. In this configuration, the differential amplifier amplifies and outputs the difference between the voltage input to the non-inverted input terminal INP and the voltage input to the inverted input terminal INN, and the amplifier amplifies the output of the difference amplifier.

The set of output circuits 21b and 22b is an example of a typical source follower circuit (drain-grounded circuit). The source follower circuit includes the drive transistors Tr11 and Tr13, and the constant current source transistors Tr12 and Tr14 constituting a current mirror. The source follower circuit typically has a high input impedance and a low output impedance. The high input impedance reduces the influence of use of the source follower circuit on the later-stage circuit, and the low output impedance enables more load to be driven. Using the source follower circuit as the output circuit enables a differential amplifier circuit to be designed with a smaller size and lower power consumption than merely driving load with the differential amplifier circuit 10. When the load imposed on the later-stage circuit is large, there is a need to increase the current flowing through the source follower circuit of the output circuit 22. However, the output circuit 22 is driven at the low source voltage VDDL, which advantageously reduces the power consumption.

The output node Y of the differential amplifier circuit 10b is connected to the gate terminals of the transistors Tr11 and Tr13, respectively. The drain terminal of the transistor Tr11 is connected to the voltage source 91 of the high source voltage VDDH. The source terminal of the transistor Tr11 is connected to the drain terminal of the transistor Tr12 and a first output node OUT1. The source terminal of the transistor Tr12 is connected to the ground node. The drain terminal of the transistor Tr13 is connected to the voltage source 92 of the low source voltage VDDL. The source terminal of the transistor Tr13 is connected to the drain terminal of the transistor Tr14 and a second output node OUT2. The source terminal of the transistor Tr14 is connected to the ground node.

The transistor Tr3 is a current mirror circuit that copies the current I of the constant current source 60 and transmits a current proportional to the ratio of the channel width W of the transistors Tr4, Tr5, and Tr6 to the transistor Tr3, to the transistors Tr4, Tr5, and Tr6. The transistors Tr3, Tr4, Tr5, and Tr6 are designed to have the same channel length L. The transistor Tr10 is a current mirror circuit that copies the current I flowing through the transistor Tr6 and transmits a current proportional to the ratio of the channel width W of the transistors Tr12 and Tr14 to the transistor Tr10, to the transistors Tr12 and Tr14. The transistors Tr10, Tr12, and Tr14 are designed to have the same channel length L.

The phase compensation circuit 51 is a first phase compensation circuit. The phase compensation circuit 51 has an input terminal connected to the output node X of the differential amplifier 10b-1 of the differential amplifier circuit 10b, and an output terminal connected to the first output node OUT1.

The phase compensation circuit 52 is a second phase compensation circuit. The phase compensation circuit 52 has an input terminal connected to the output node X of the differential amplifier 10b-1 of the differential amplifier circuit 10b, and an output terminal connected to the second output node OUT2. For example, each of the phase compensation circuits 51 and 52 includes a resistor and a capacitor, which are connected in series.

The phase compensation circuits 51 and 52 are connected to the output circuits 21b and 22b, respectively, which enables a phase compensation to be properly performed in operating the output circuits 21b and 22b.

In FIG. 5, each transistor is a field effect transistor (FET). However, no limitation is intended hereby, and alternatively, a bipolar transistor may be used.

Figure 6A:
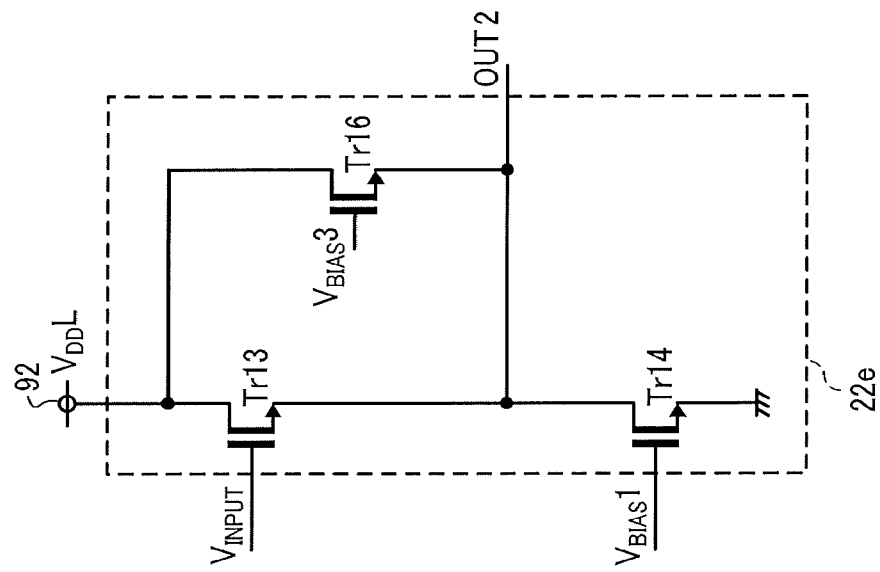
FIGS. 6A, 6B, and 6C are circuit diagrams of output circuits according to different embodiments of the present disclosure.
Figure 6B:
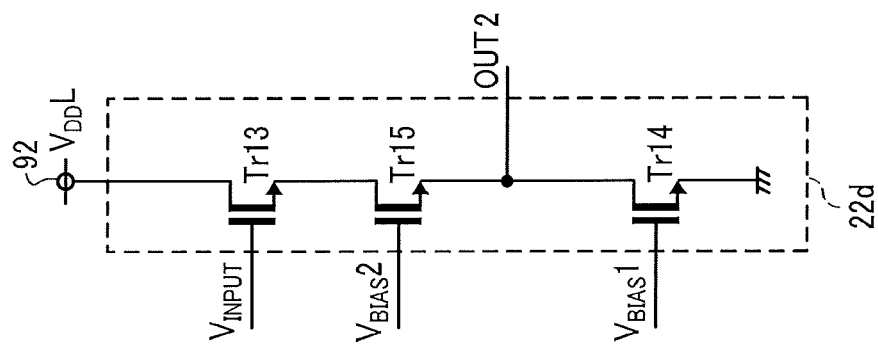
Figure 6C:
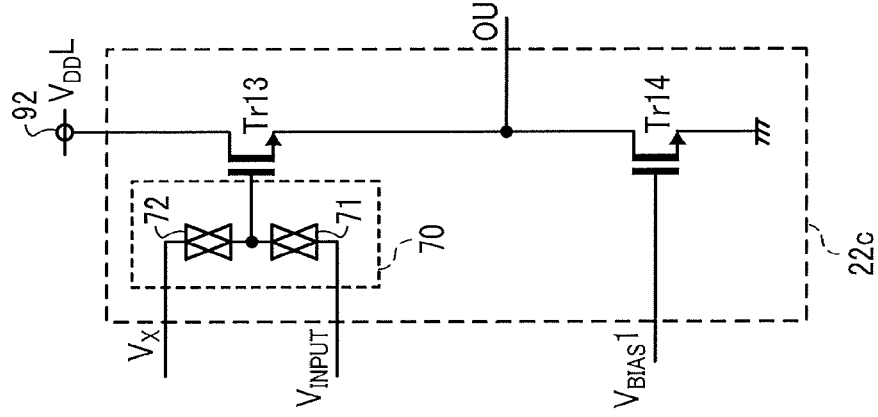

FIGS. 6A, 6B, and 6C are circuit diagrams of output circuits 22c, 22d, and 22e having three different configurations. The output circuit 22b of FIG. 5 may be replaced with each of the output circuits 22c, 22d, and 22e. Further, each of the configuration examples of the output circuits 22c, 22d, and 22e in FIGS. 6A, 6B, and 6C may be applied to the output circuit 21b in FIG. 5.

The output circuits 22c, 22d, and 22e will be described with reference to the configuration example of FIG. 5.

The input voltage VINPUT is an output from the output node Y of the differential amplifier circuit 10b, and is an input to be received by the output circuits 22c, 22d, and 22e.

The voltage VBIAS1 is, for example, a bias voltage of the current mirror circuit constituted by the transistor Tr10 in FIG. 5. Each of the output circuits 22c, 22d, and 22e is configured to receive the voltage VBIAS1. The output node OUT 2 is an output node of the output circuits 22c, 22d, and 22e.

The output circuit 22c in FIG. 6A has a configuration example in which the output circuit 22b in FIG. 5 further includes a switching circuit 70.

The switching circuit 70 includes analog switches 71 and 72. The switching circuit 70 is electrically connectable to and disconnectable from the output node of the differential amplifier circuit by the analog switches 71 and 72. When the switching circuit 70 is electrically disconnected from the differential amplifier circuit based on the operating phase, the switching circuit 70 switches to a mode to receive any level of source voltage.

The analog switch 71 has one end connected to the gate terminal of the transistor Tr13, and has the other end connected to the output node Y of the differential amplifier circuit 10b to receive the input voltage VINPUT. The analog switch 72 has one end connected to the gate terminal of the transistor Tr13, and has the other end connected to the voltage source of a voltage with any electrical potential VX.

Each of the analog switches 71 and 72 becomes active with a high input. The analog switches 71 and 72 are controlled not to be turned on at the same time.

In the output circuit 22c, the analog switches 71 and 72 are turned ON or OFF in synchronization with the analog switches 31 and 32 in FIG. 3. In the period in which the output circuits 21b and 22b are not driven, the output circuits 21b and 22b are electrically disconnected from the differential amplifier circuit 10b.

Specifically, when the switching circuit 70 is disposed as a first switching circuit in the output circuit 21b (the first output circuit), the first switching circuit 70 receives an output (the input voltage VINPUT) of the differential amplifier circuit 10b in the first phase, and switches to the mode to receive a voltage of any electrical potential VX in the second phase.

When the switching circuit 70 is disposed as a second switching circuit in the output circuit 22b (the second output circuit), the second switching circuit switches to the mode to receive a voltage of any electrical potential VX in the first phase, and switches to the mode to receive an output of the differential amplifier circuit 10b in the second phase.

This configuration reduces the load on the differential amplifier circuit 10b, which enables the differential amplifier circuit 10b to operate more rapidly.

In such a configuration, the switching circuit 70 is connected to or disconnected from the voltage source of any electrical potential VX via the analog switch 72. This arrangement enables the transistor Tr13 to be maintained ON (active) or OFF.

When the electrical potential VX is set to turn off the transistor Tr13, no current flows through the output circuit 22, which reduces the power consumption.

In contrast, when the electrical potential VX is set to turn on the transistor Tr13, the fluctuations in the current of the power source line due to the switching of the analog switches 71 and 72 are eliminated. This prevents the occurrence of fluctuations (noise) in the power source line due to spikes in electric current and resistance (IR) drop (voltage drop).

The output circuit 22d in FIG. 6B has a configuration example in which the output circuit 22b in FIG. 5 further includes a transistor Tr15.

The transistor Tr15 is connected in series between the source terminal of the transistor Tr13 and the drain terminal (output node OUT2) of the transistor Tr14.

The transistor Tr15 serves to reduce the upper limit (that is substantially the low source voltage VDDL in the configuration of the output circuit 22b in FIG. 5) of the range of the voltage output from the output node OUT2, according to the voltage VBIAS2 applied to the gate terminal of the transistor Tr15.

As the voltage VBIAS2 increases, the upper limit of the range of the voltage output from the output node OUT2 decreases.

The output circuit 22e in FIG. 6C has a configuration example in which the output circuit 22b in FIG. 5 further includes a transistor Tr16.

The transistor Tr16 is connected in parallel between the drain terminal (the source voltage) of the transistor Tr13 and the drain terminal (output node OUT2) of the transistor Tr14.

The transistor Tr16 serves to increase the lower limit (that is substantially the ground voltage in the configuration of the output circuit 22b in FIG. 5) of the range of the voltage output from the output node OUT2, according to the voltage VBIAS3 applied to the gate terminal of the transistor Tr16.

As the voltage VBIAS3 increases, the lower limit of the range of the voltage output from the output node OUT2 increases.

The configurations of the output circuits 22d and 22e prevent the circuits following the output circuits 22d and 22e from taking time to return to the normal operation even when the output circuits 22d and 22e reach saturation in which there is no change in current even with variations in the source voltage and the ground voltage. That is, the configurations of the output circuits 22d and 22e reduce the adverse effect on the later-stage circuit.

In some examples, the output circuits 22c, 22d, and 22e may be combined with each other. In this case, the respective effects are redundantly exerted.

Figure 7A:
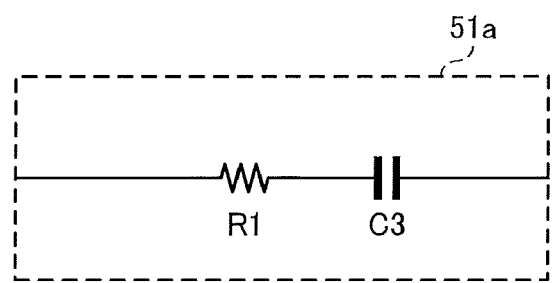
FIGS. 7A and 7B are circuit diagrams of phase compensation circuits according to embodiments of the present disclosure.
Figure 7B:
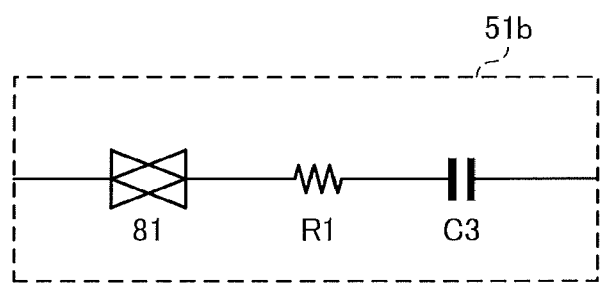

FIGS. 7A and 7B are circuit diagrams of configuration examples of phase compensation circuits 51a and 51b.

Each of the phase compensation circuits 51a and 51b includes a resistor R1 and a capacitor C3. The phase compensation circuit 51b further includes an analog switch 81. The configuration of each of the phase compensation circuits 51a and 51b is applicable to the phase compensation circuit 52.

The phase compensation circuit 51a in FIG. 7A is a typical resistance capacitance (RC) serial phase compensation circuit. In some examples, the phase compensation circuit 51a may include only the capacitor C3.

The phase compensation circuit 51b in FIG. 7B has a configuration in which the analog switch 81 is connected in series to the resistor R1 and the capacitor C3. The phase compensation circuit 51b operates in synchronization with the analog switch 71 in FIG. 6A, for example.

Specifically, when the analog switch 71 is turned off, the gate terminal of the transistor Tr13 is electrically disconnected from the differential amplifier. Accordingly, the capacitor C3 imposes a load on the differential amplifier 10b-1. To eliminate such an extra load, the phase compensation circuit 51 is also electrically disconnected from the differential amplifier. The resistor R1 may be omitted due to the ON resistance of the analog switch 81.

As described above, the semiconductor integrated circuit 100 according to at least one embodiment of the present disclosure includes a circuit driven at a high source voltage VDDH (for example, 3.3V and 5V) and a circuit driven at a low source voltage VDDL (for example, 1.5V and 1.8V). The semiconductor integrated circuit 100 is driven by at least two types of source voltages.

Further, in the configuration of a differential amplifier circuit including an external feedback circuit that constitutes a part of a circuit driven at a high source voltage, the semiconductor integrated circuit 100 includes a differential amplifier circuit, a first output circuit, and a second output circuit. The differential amplifier circuit amplifies and outputs the difference between the inverted input and the non-inverted input. The first output circuit operates at the high source voltage. The second output circuit operates at the low source voltage. In the sampling operation, the first output circuit performs feedback on the first output. In the amplification operation, the second circuit performs feedback on the second output.

This configuration enables a limit to be imposed on the output voltage without restricting the range of the voltage to be fed back to the differential amplifier circuit, without the use of any complicated protection circuit. The configurations according to the embodiments of the present disclosure enable a compact circuit to be produced while enabling a limit to be imposed on an output voltage of a high-voltage driving circuit without restricting a voltage to be fed back to a differential amplifier circuit in the semiconductor integrated circuit in which the output of the high-voltage driving circuit is connected to the input of the low-voltage driving circuit.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A semiconductor integrated circuit comprising:
   a differential amplifier circuit that operates at a first source voltage;
   a first output circuit that is electrically connectable to the differential amplifier circuit, the first output circuit receiving an output of the differential amplifier circuit, the first output circuit outputting a first output, and the first output circuit operating at the first source voltage;
a second output circuit that is electrically connectable to the differential amplifier circuit, the second output circuit receiving an output of the differential amplifier circuit, the second output circuit outputting a second output, and the second output circuit operating at a second source voltage lower that is than the first source voltage;
a selection circuit that is electrically connectable to each of the first output circuit and the second output circuit, the selection circuit selecting one of the first output and the second output according to an operating phase based on an external control signal; and
a feedback circuit that is connected between the differential amplifier circuit and the selection circuit, the feedback circuit feeding a selected one of the first output and the second output back to the differential amplifier circuit, wherein
the operating phase includes:
a first phase to sample and feed an input from the differential amplifier circuit back to the differential amplifier circuit, and
a second phase to amplify the input from the differential amplifier circuit,
the selection circuit selects the first output in the first phase, and
the selection circuit selects the second output in the second phase.

2. The semiconductor integrated circuit according to claim 1, wherein
the selection circuit outputs the second output to a later-stage circuit in the second phase, and
the selection circuit does not output the first output to the later-stage circuit in the first phase.

3. The semiconductor integrated circuit according to claim 1, wherein the first output circuit and the second output circuit comprise a source follower circuit.

4. The semiconductor integrated circuit according to claim 1, wherein
the first output circuit is electrically connectable to and disconnectable from an output node of the differential amplifier circuit, and
the first output circuit includes a first switching circuit to switch to a mode to receive a level of a source voltage when the first output circuit is electrically disconnected from the output node of the differential amplifier according to the operating phase.

5. The semiconductor integrated circuit according to claim 1, wherein
the second output circuit is electrically connectable to and disconnectable from an output node of the differential amplifier circuit, and
the second output circuit includes a second switching circuit to switch to a mode to receive a level of a source voltage when the second output circuit is electrically disconnected from the output node of the differential amplifier according to the operating phase.

6. The semiconductor integrated circuit according to claim 1, wherein
the selection circuit includes:
a first switch connected to a first output node of the first output circuit; and
a second switch connected to a second output node of the second output circuit, and when one of the first switch and the second switch is on, based on the operating phase, the other of the first switch and the second switch is off.

7. The semiconductor integrated circuit according to claim 6, wherein
the selection circuit is connected between a circuit following the selection circuit and each of the first switch and the second switch, and
the selection circuit further includes a third switch that is turned on when the second switch is on.

8. The semiconductor integrated circuit according to claim 1, wherein the differential amplifier circuit includes:
a differential amplifier that amplifies and outputs a difference between a voltage input to a non-inverted input terminal and a voltage input to an inverted input terminal;
a first phase compensation circuit connected between an output node of the differential amplifier and a first output node of the first output circuit; and
a second phase compensation circuit connected between the output node of the differential amplifier and a second output node of the second output circuit.

9. The semiconductor integrated circuit according to claim 8, wherein at least one of the first phase compensation circuit and the second phase compensation circuit is electrically disconnectable from the differential amplifier.

10. A semiconductor integrated circuit, comprising:
a differential amplifier circuit that operates at a first source voltage;
a first output circuit that is electrically connectable to the differential amplifier circuit, the first output circuit receiving an output of the differential amplifier circuit, the first output circuit outputting a first output, and the first output circuit operating at the first source voltage;
a second output circuit that is electrically connectable to the differential amplifier circuit, the second output circuit receiving an output of the differential amplifier circuit, the second output circuit outputting a second output, and the second output circuit operating at a second source voltage lower that is than the first source voltage;
a selection circuit that is electrically connectable to each of the first output circuit and the second output circuit, the selection circuit selecting one of the first output and the second output according to an operating phase based on an external control signal; and
a feedback circuit that is connected between the differential amplifier circuit and the selection circuit, the feedback circuit feeding a selected one of the first output and the second output back to the differential amplifier circuit, wherein
the selection circuit includes:
a first switch connected to a first output node of the first output circuit; and
a second switch connected to a second output node of the second output circuit,
when one of the first switch and the second switch is on, based on the operating phase, the other of the first switch and the second switch is off,
the selection circuit is connected between a circuit following the selection circuit and each of the first switch and the second switch, and
the selection circuit further includes a third switch that is turned on when the second switch is on.

11. The semiconductor integrated circuit according to claim 10, wherein the selection circuit outputs the second output to a later-stage circuit in a second phase, and the selection circuit does not output the first output to the later-stage circuit in a first phase.

12. The semiconductor integrated circuit according to claim 10, wherein the first output circuit and the second output circuit comprise a source follower circuit.

13. The semiconductor integrated circuit according to claim 10, wherein the first output circuit is electrically connectable to and disconnectable from an output node of the differential amplifier circuit, and the first output circuit includes a first switching circuit to switch to a mode to receive a level of a source voltage when the first output circuit is electrically disconnected from the output node of the differential amplifier according to the operating phase.

14. The semiconductor integrated circuit according to claim 10, wherein the second output circuit is electrically connectable to and disconnectable from an output node of the differential amplifier circuit, and the second output circuit includes a second switching circuit to switch to a mode to receive a level of a source voltage when the second output circuit is electrically disconnected from the output node of the differential amplifier according to the operating phase.

15. The semiconductor integrated circuit according to claim 10, wherein the differential amplifier circuit includes:

a differential amplifier that amplifies and outputs a difference between a voltage input to a non-inverted input terminal and a voltage input to an inverted input terminal;

a first phase compensation circuit connected between an output node of the differential amplifier and a first output node of the first output circuit; and a second phase compensation circuit connected between the output node of the differential amplifier and a second output node of the second output circuit.

16. The semiconductor integrated circuit according to claim 15, wherein at least one of the first phase compensation circuit and the second phase compensation circuit is electrically disconnectable from the differential amplifier.

17. A semiconductor integrated circuit, comprising:

a differential amplifier circuit that operates at a first source voltage;

a first output circuit that is electrically connectable to the differential amplifier circuit, the first output circuit receiving an output of the differential amplifier circuit, the first output circuit outputting a first output, and the first output circuit operating at the first source voltage;

a second output circuit that is electrically connectable to the differential amplifier circuit, the second output circuit receiving an output of the differential amplifier circuit, the second output circuit outputting a second output, and the second output circuit operating at a second source voltage lower that is than the first source voltage;

a selection circuit that is electrically connectable to each of the first output circuit and the second output circuit, the selection circuit selecting one of the first output and the second output according to an operating phase based on an external control signal; and a feedback circuit that is connected between the differential amplifier circuit and the selection circuit, the feedback circuit feeding a selected one of the first output and the second output back to the differential amplifier circuit, wherein the differential amplifier circuit includes:

a differential amplifier that amplifies and outputs a difference between a voltage input to a non-inverted input terminal and a voltage input to an inverted input terminal;

a first phase compensation circuit connected between an output node of the differential amplifier and a first output node of the first output circuit; and a second phase compensation circuit connected between the output node of the differential amplifier and a second output node of the second output circuit.

18. The semiconductor integrated circuit according to claim 17, wherein at least one of the first phase compensation circuit and the second phase compensation circuit is electrically disconnectable from the differential amplifier.

19. The semiconductor integrated circuit according to claim 17, wherein the selection circuit outputs the second output to a later-stage circuit in a second phase, and the selection circuit does not output the first output to the later-stage circuit in a first phase.

20. The semiconductor integrated circuit according to claim 17, wherein the first output circuit and the second output circuit comprise a source follower circuit.

* * * * *